(12) United States Patent
Feng et al.

(10) Patent No.: US 8,871,553 B2
(45) Date of Patent: Oct. 28, 2014

(54) PHOTOVOLTAIC DEVICE

(71) Applicant: First Solar, Inc., Perrysberg, OH (US)

(72) Inventors: Wenlai Feng, Perrysburg, OH (US);
Brian Cohen, Perrysburg, OH (US);
Bruce Bengtson, Maplewood, MN (US);
Casimir Kotarba, Perrysburg, OH (US)

(73) Assignee: First Solar, Inc., Perrysburg, OH (US)

( * ) Notice: Subject to any disclaimer, the term of this patent is extended or adjusted under 35 U.S.C. 154(b) by 0 days.

(21) Appl. No.: 13/631,111

(22) Filed: Sep. 28, 2012

(65) Prior Publication Data

US 2013/0084670 A1    Apr. 4, 2013

Related U.S. Application Data

(60) Provisional application No. 61/541,224, filed on Sep. 30, 2011.

(51) Int. Cl.
*C09K 3/00* (2006.01)
*H01L 31/18* (2006.01)
*H01L 31/048* (2014.01)

(52) U.S. Cl.
CPC ............. *H01L 31/0481* (2013.01); *Y02E 10/50* (2013.01)
USPC ....................... 438/64; 252/194; 257/E31.117

(58) Field of Classification Search
None
See application file for complete search history.

(56) References Cited

U.S. PATENT DOCUMENTS

| | | | |
|---|---|---|---|
| 7,557,291 B2* | 7/2009 | Flaherty et al. | 136/244 |
| 2011/0048509 A1* | 3/2011 | Becker et al. | 136/252 |
| 2013/0068279 A1* | 3/2013 | Buller et al. | 136/244 |

FOREIGN PATENT DOCUMENTS

WO   WO 2009036752 A1 * 3/2009

* cited by examiner

*Primary Examiner* — Ling Choi
*Assistant Examiner* — Catherine S Branch
(74) *Attorney, Agent, or Firm* — Dickstein Shapiro LLP

(57) ABSTRACT

A moisture trapping filler composition may include a filler material combined with a desiccant material.

28 Claims, 17 Drawing Sheets

PHOTOVOLTAIC DEVICE

CROSS-REFERENCE TO RELATED APPLICATION

The present application claims priority to Provisional U.S. Patent App. No. 61/541,224, filed on Sep. 30, 2011, the entirety of which is incorporated by reference herein.

TECHNICAL FIELD

The present invention relates to moisture trapping filler, photovoltaic devices with moisture trapping filler, and methods for manufacturing photovoltaic devices with moisture trapping filler.

BACKGROUND

A photovoltaic device is commonly installed in an outdoor location to allow for direct exposure to sunlight. However, an outdoor installation also exposes the device to moisture in the form of precipitation and humidity. Moisture can be harmful to the various layers and components within the device. For example, moisture can promote corrosion of electrical contacts within the device. As the contacts corrode, electrical resistance in the circuitry can increase thereby reducing power output and efficiency of the device. Moreover, water that is permitted to freeze and expand within the device can result in structural damage.

DETAILED DESCRIPTION

Figure 1:
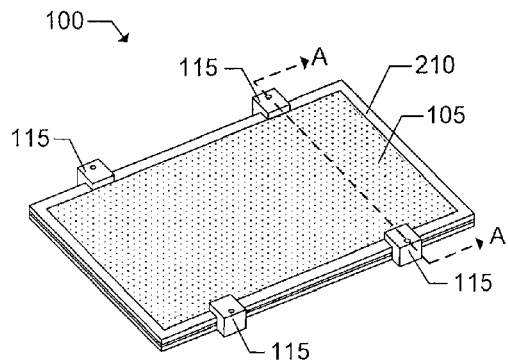
FIG. 1 is a top perspective view of an example photovoltaic device.
Figure 2:
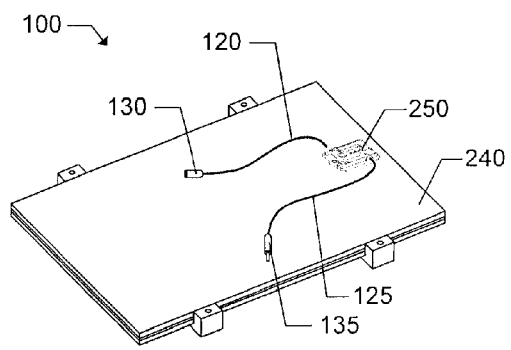
FIG. 2 is a bottom perspective view of the photovoltaic device of FIG. 1.

A photovoltaic (PV) device converts light to electricity and may include various layers formed on a substrate. By way of example, FIG. 1 shows a top perspective view of an exemplary PV device 100, and FIG. 2 shows a bottom perspective view of the same device. The PV device is configured to receive sunlight on its top surface, which may include an anti-reflective (AR) coating. The AR coating increases light transmission into the PV device by decreasing the amount of sunlight that is reflected from the top surface. As shown in FIG. 2, the PV device 100 may include a junction box 250 for electrically connecting the device to other electrical devices. Note that a PV device may be a PV cell or a PV module, which generally includes a plurality of PV cells, PV components, etc.

Figure 3:
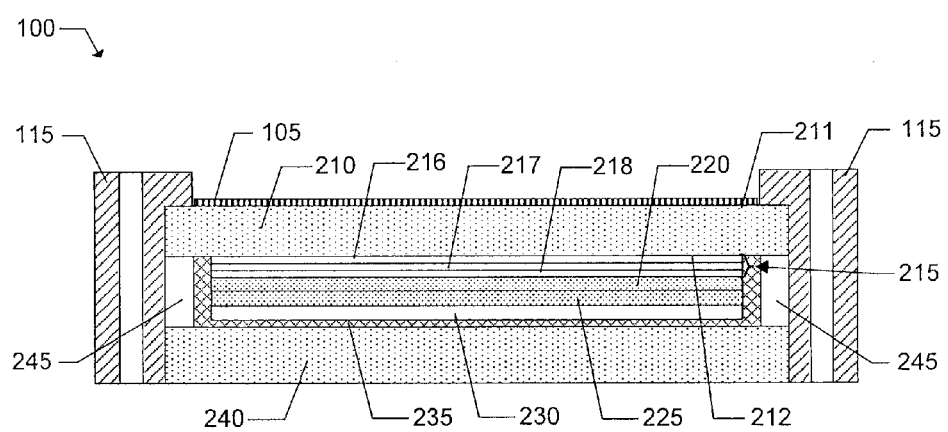
FIG. 3 is a cross-sectional view of the photovoltaic device of FIG. 1 taken along section A-A.

FIG. 3, which is a cross-sectional view of FIG. 1 taken along section A-A, depicts the various layers of an exemplary PV device 100. As can be seen from the figure, the PV device 100 includes a substrate layer 210 on which the various layers are formed. The substrate layer 210 is one of the outermost layers of the device and can be exposed to a variety of temperatures and different forms of precipitation over the life of the device 100. The substrate layer 210 is often the first layer that incident light encounters upon entering the device. Therefore, it is desirable to select a material that is both durable and highly transparent. For these reasons, the substrate layer 210 may be, for example, glass. And it can be desirable to select a type of glass having low iron content, since it provides greater light transmission than glasses containing standard amounts of iron. Examples of suitable glass types include borosilicate glass, soda lime glass, and float glass.

The substrate layer 210 may include an outer surface 211 and an inner surface 212. As mentioned before, the PV device 100 may include an anti-reflective ("AR") coating 105. The AR coating 105 is formed adjacent to the outer surface 211 of the substrate 210. The AR coating 105 may be a single layer or a plurality of layers. For instance, the AR coating 105 may be a stack of layers. The AR coating 105 may include any suitable material such as, for example, magnesium fluoride ($MgF_2$), fluorocarbon based polymers, fluorosilicon-based polymers, or porous materials. Suitable fluorocarbon based polymers may include polyvinyl fluoride (PVF), polyvinylidene fluoride (PVDF), polytetrafluoroethylene (PTFE), polychlorotrifluoroethylene (PCTFE), perfluoroalkoxy polymer (PFA), fluorinated ethylene-propylene (FEP), polyethylenetetrafluoroethylene (ETFE), polyethylenechlorotrifluoroethylene (ECTFE), and perfluoropolyether (PFPE). Suitable porous materials may include aluminum oxide, titanium dioxide, magnesium oxide, silicon monoxide, silicon dioxide, or tantalum pentoxide. The AR coating 105 may have a thickness ranging from about 0.1 microns to about 1.0 micron.

To provide a front contact layer 215 for the device 100, a conductive layer is formed adjacent to the inner surface 212 of the substrate layer 210. The front contact layer 215 may include a stack of layers. The stack of layers, which are referred to as a transparent conductive oxide (TCO) stack, can include a barrier layer 216, a TCO layer 217, and a buffer layer 218. These layers (e.g. 216, 217 and 218) can be formed sequentially on the inner surface 212 of the substrate 210. Alternately, the front contact layer 215 can be formed in a series of manufacturing steps separate from the device 100 and added to the device 100 in a single step.

The barrier layer 216 can be incorporated between the substrate layer 210 and the TCO layer 217 and can lessen diffusion or movement of sodium or other contaminants from the substrate layer 210 to other layers within the device 100. These other layers can include active layers such as a semiconductor window layer 220 and a semiconductor absorber layer 225. Diffusion of sodium can result in degradation of the device and delamination of some layers. For example, during operation, the PV device 100 produces an electric field. The electric field can attract sodium ions toward the TCO layer 217. As a result, an accumulation of sodium can form near the interface between the TCO layer 217 and the substrate layer 210. If moisture ingression occurs, the accumulated sodium can react with water to form sodium hydroxide and hydrogen. Since sodium hydroxide is a highly alkaline solution with a pH greater than 9, it can rapidly dissolve the substrate layer 210 at elevated temperatures. In addition, the generation of hydrogen near the interface may lead to a weakening of interfacial bonds due to the reduction of, for example, tin oxide in the TCO layer 217.

The barrier layer 216 should be transparent to allow sunlight to reach the active layers in the PV device 100. The barrier layer should also be thermally stable, since the barrier layer can be exposed to high temperatures during manufacturing processes. Finally, to combat sodium diffusion as discussed above, the barrier layer 216 should have a high sodium-blocking capability and good adhesive properties. To meet these requirements, the barrier layer may include any suitable material such as, for example, silicon aluminum oxide (SiAlxOy), silicon oxide (SiO2), tin oxide (SnO), or a combination thereof. The barrier layer may have a thickness ranging from about 100 A to about 3000 A. Preferably, the barrier layer may have a thickness ranging from about 250 A to about 750 A.

The TCO layer 217 may be formed adjacent to the barrier layer 216. It can be desirable to select a material that is highly conductive for the TCO layer 217. Also, it can be desirable to select a material that is highly transparent, since solar radiation must pass through the TCO layer 217 to reach the active layers. To achieve high conductivity and high transparency, the TCO layer 217 can include any suitable material such as, for example, tin oxide (SnO), cadmium stannate ($Cd_2SnO_4$), tin-doped indium oxide, fluorine-doped tin oxide (SnO:F), cadmium tin oxide, cadmium indium oxide (CIO), aluminum zinc oxide (ZAO), or a combination thereof. The TCO layer 217 can have a thickness ranging from about 500 A to about 5000 A. Preferably, the TCO layer can have a thickness ranging from about 3500 A to about 4500 A.

The buffer layer 218 can be a smooth layer deposited between the TCO layer 217 and semiconductor window layer 220 that decreases the likelihood of irregularities occurring during the formation of the semiconductor window layer 220. In addition, the buffer layer 218 inhibits diffusion between the window layer 220 and the TCO layer 217 by preventing the two layers from contacting each other. The buffer layer 218 can include any suitable material, including tin oxide, zinc tin oxide, zinc oxide, and zinc magnesium oxide. The buffer layer 218 can have a thickness ranging from about 50 A to about 2000 A. Preferably, the thickness of the buffer layer 218 can range from about 500 A to about 1000 A.

In one example, the semiconductor window layer 220 can include a thin layer of cadmium sulfide (CdS). The thickness of the semiconductor window layer 220 may range from about 100 A to about 1000 A. Preferably, the thickness of the semiconductor window layer 220 may range from about 200 A to about 400 A. The semiconductor window layer 220 may be formed using any suitable thin-film deposition technique such as, for example, physical vapor deposition, atomic layer deposition, laser ablation, chemical vapor deposition, close-spaced sublimation, electrodeposition, screen printing, DC pulsed sputtering, RF sputtering, AC sputtering, chemical bath deposition, or vapor transport deposition.

The semiconductor absorber layer 225 may be formed adjacent to the semiconductor window layer 220 and may include any suitable material such as, for example, cadmium telluride (CdTe), cadmium selenide, amorphous silicon, copper indium (di)selenide (CIS), or copper indium gallium (di) selenide (CIGS). The semiconductor absorber layer 225 may be deposited using any suitable deposition technique such as, for example, physical vapor deposition, sputtering, atomic layer deposition, laser ablation, chemical vapor deposition, close-spaced sublimation, electrodeposition, or screen printing. The semiconductor absorber layer 225 may have a thickness ranging from about 1 μm to about 10 μm. Preferably, the semiconductor absorber layer 225 may have a thickness ranging from about 2 μm to about 5 μm. The semiconductor absorber layer 225 may be formed using any suitable thin-film deposition technique such as, for example, physical vapor deposition, atomic layer deposition, laser ablation, chemical vapor deposition, close-spaced sublimation, electrodeposition, screen printing, DC pulsed sputtering, RF sputtering, AC sputtering, chemical bath deposition, or vapor transport deposition.

The semiconductor window layer 220 may be an n-type semiconductor layer, and the semiconductor absorber layer 225 may be a p-type semiconductor. Having the n-type semiconductor window layer 220 in close contact to the p-type semiconductor absorber layer 225 forms a p-n junction, which facilitates conversion of light to electricity.

A back contact layer 230 may be formed adjacent to the semiconductor absorber layer 225. Similar to the front contact layer 215, the back contact layer 230 serves an electrical contact for the device 100. Accordingly, the back contact layer 230 may include one or more highly conductive materials. For example, the back contact layer 230 may include molybdenum, aluminum, copper, silver, gold, or any combination thereof.

An interlayer 235 may be formed adjacent to the back contact layer 230. The interlayer 235 may be formed through a lamination process or any other suitable formation technique. The interlayer 235 may serve as a waterproof, dielectric barrier that protects the active layers and contacts from moisture-related corrosion. The interlayer 235 may include any suitable dielectric material such as, for example, a thermoplastic copolymer resin such as ethylene vinyl acetate ("EVA"), polyvinyl butyral ("PVB"), thermoplastic polyurethane ("TPU"), or polyolefin.

To further protect the device 100 from moisture ingress, an edge sealant 245 may be added around the perimeter of the device 100 and may include any suitable material such as butyl rubber. The edge sealant 245 may also serve as an adhesive that bonds the substrate 210 to a back cover 240. Like the substrate layer 210, the back cover 240 is an outermost layer of the device 100 and can be exposed to a variety of temperatures and different forms of precipitation over the life of the device 100. To protect the device 100 from these conditions, the back cover 240 may include a protective material such as borosilicate glass, float glass, soda lime glass, polycarbonate, or a polymer-based back sheet.

During operation, sunlight enters the device 100 by passing through the substrate layer 210. Photons are then absorbed at a p-n junction region, and, as a result, photo-generated electron-hole pairs are formed. Movement of the electron-hole pairs is promoted by a built-in electric field, thereby producing electrical current, which flows between a first cable 120 connected to the front contact layer 215 and a second cable 125 connected to the back contact layer 230 (see FIGS. 1 and 2).

Figure 4:
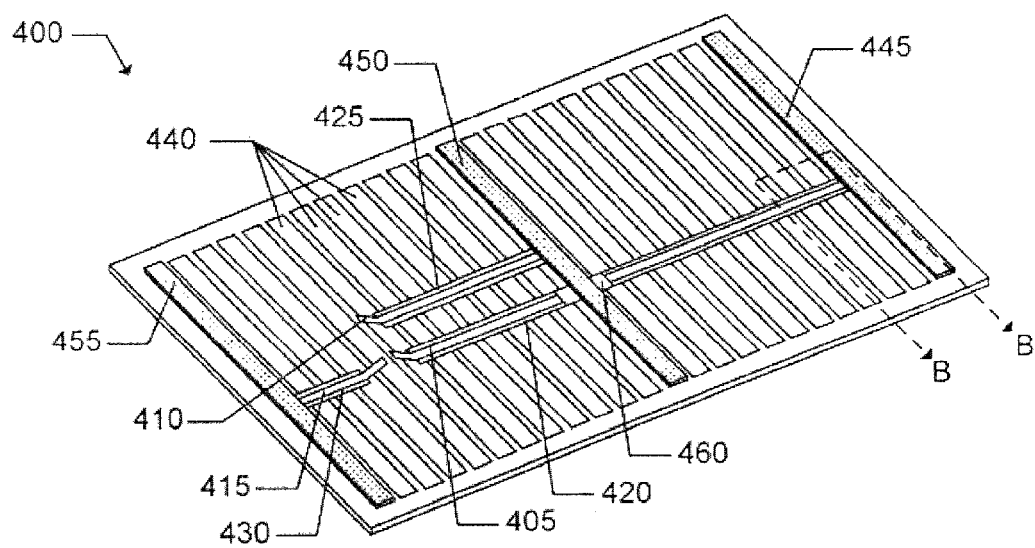
FIG. 4 is a bottom perspective view of a partially assembled photovoltaic device prior to installation of the interlayer and back cover.
Figure 5:
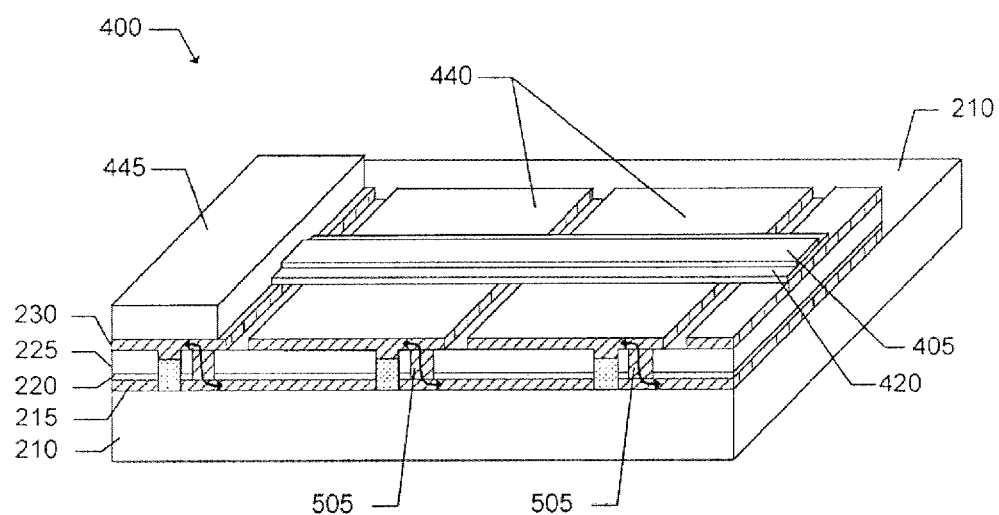
FIG. 5 is a cross-sectional view of the partially assembled photovoltaic device of FIG. 4 taken along section B-B.

FIG. 4 shows a partially assembled PV device 400, which includes a plurality of photovoltaic cells 440. By showing the partially assembled PV device 400 without at least an interlayer 235 and a back cover 240, the inner layers of the device become visible. A cross-sectional view of the partially assembled photovoltaic device 400 is shown in FIG. 5. The cross-section is taken along section B-B of FIG. 4. As shown FIG. 5, adjacent cells can be electrically connected via electrical interconnects 505. The interconnects 505 can be formed through a combination of scribing and deposition steps, where scribing involves material removal and deposition involves material addition. Scribing may include laser scribing with, for example, pulsed lasers to remove portions of layers, such as the semiconductor layers (e.g. 220, 225), positioned between the front contact 215 and the back contact 440, as shown in FIG. 5. By scribing, one large PV cell can be transformed into a plurality of smaller PV cells, which allows for greater design control over current and voltage output.

Once the smaller PV cells have been created through scribing, they must be electrically connected in a reliable manner. This is accomplished by depositing electrical interconnects 505, as shown in FIG. 5. The interconnects 505 are highly conductive and allow current to travel between adjacent PV cells. For example, the interconnects 505 may connect the front contact of a first cell to the back contact of a neighboring cell, thereby providing a series connection between the two cells. Deposition of the interconnect material can be accomplished using any suitable deposition technique such as physical vapor deposition, chemical vapor deposition, electrochemical deposition, reactive vapor deposition, or liquid polymer injection. Physical vapor deposition may include sputtering or evaporation, and chemical vapor deposition may include plasma enhanced chemical vapor deposition or atomic layer deposition.

The scribing and deposition steps create active areas and dead areas within the device. Active areas produce photo-generated current, whereas dead areas do not. Therefore, to improve conversion efficiency of the device, it is desirable to minimize the size of the dead areas. Dead area size can be reduced by decreasing the width of the trenches between adjacent cells, which can be accomplished by using a laser with a narrow beam diameter.

During the scribing and deposition steps, adjacent cells may be interconnected in series or parallel. In some instances, all cells in the device may be connected in series. In other cases, it may be desirable to subdivide the device into two or more sub-devices. The sub-devices can then be connected in parallel to provide higher current output. Subdivision of the device can be accomplished by omitting an interconnect 505 between two adjacent cells and inserting a nonconductive material in place of the interconnect 505. FIG. 4 shows an example of a device 400 that is divided into two sub-devices.

Once the device 400 has been divided into sub-devices, a series of steps can be used to electrically connect the sub-devices. For example, the sub-devices can be electrically connected through a lay-up process that resembles the device shown in FIG. 4. In particular, FIG. 4 shows the rear side of the PV device prior to installation of the interlayer 235 and the back cover 240. The back contact layer 230 of each cell is visible as well as several busbars (e.g. 410, 415, 420, 445, 450, 455). The busbars conduct electrical current within the device and can be made of conductive tape, which allows the device to retain a thin profile.

FIG. 4 shows one method of arranging portions of conductive tape within the device 100 during manufacturing. Once the back contact layer 230 has been formed, one or more portions of insulating tape (e.g. 420, 425, 430) may be formed adjacent thereto. The portions of insulating tape (420, 425, 430) may be constructed from any suitable dielectric material and may each have a first side and a second side. The first and second sides may include an adhesive coating similar to double-sided tape. In one example, the insulating tape may be a product similar to 3M Double Coated Dielectric Tape. Portions of conductive tape (e.g. 405, 410, 415) may then be formed over the portions of insulating tape (e.g. 420, 425, 430), whereby the adhesive layer prevents movement of either layer. The insulating tape (420, 425, 430) prevents short-circuiting in the device by preventing the conductive tape (405, 410, 415) from contacting the back contact layer 440 of each PV cell.

Figure 6:
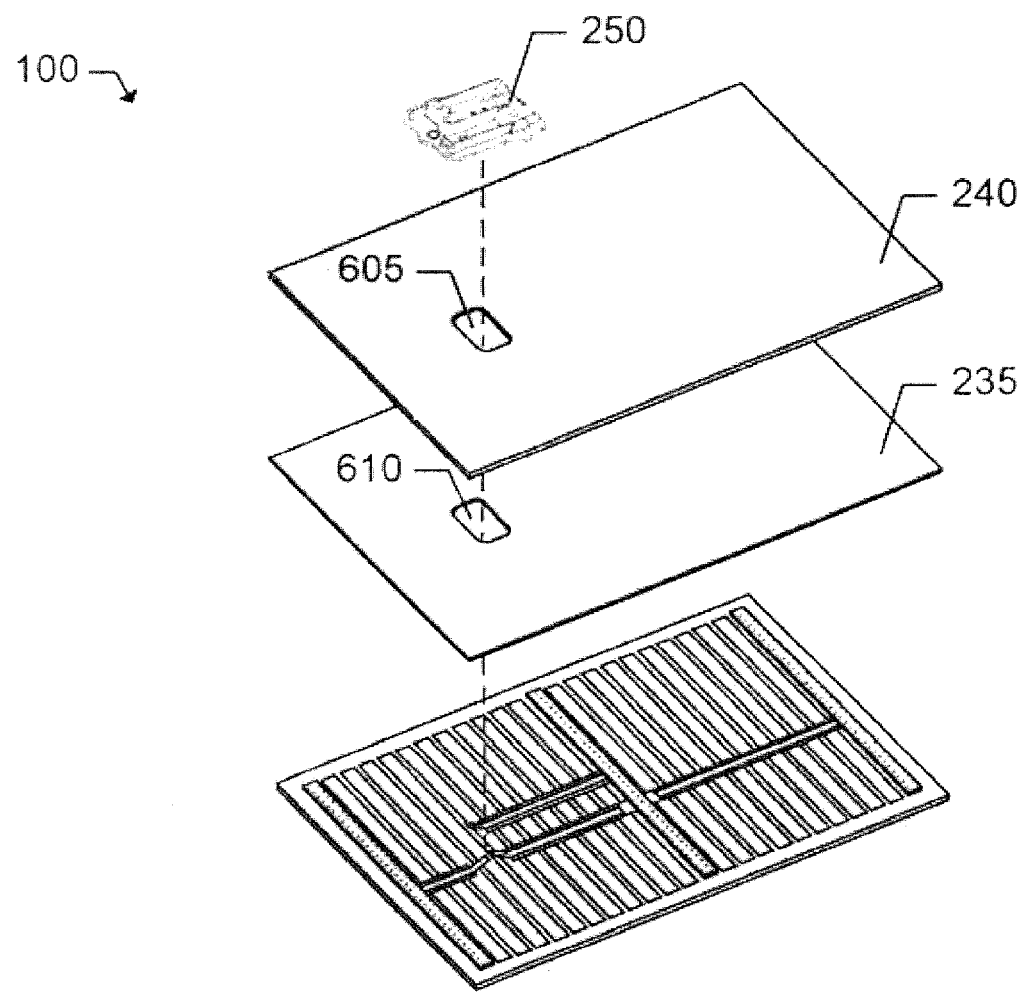
FIG. 6 is an exploded bottom perspective view of a photovoltaic device.
Figure 6A:
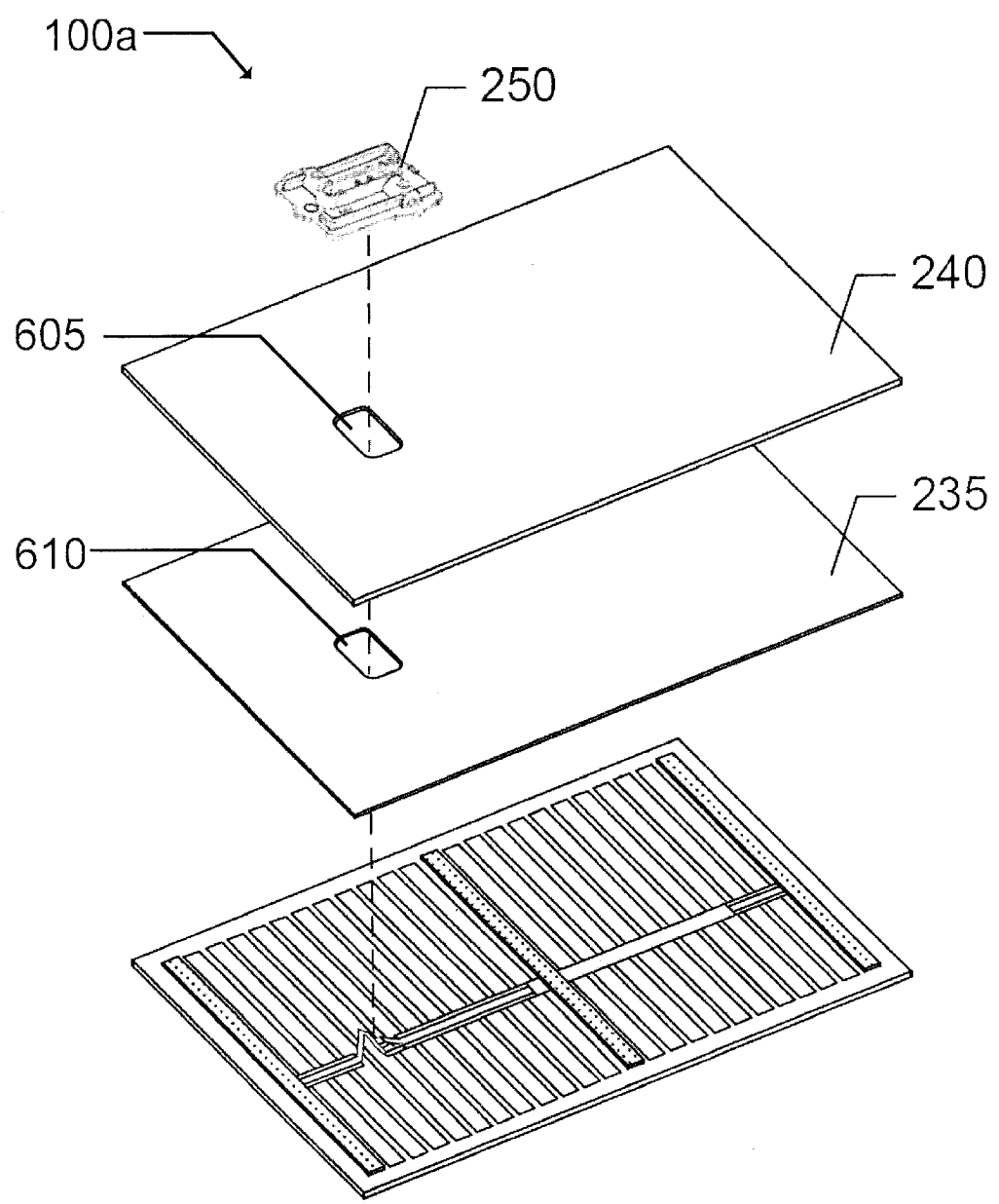
FIG. 6A is an exploded bottom perspective view of a photovoltaic device according to a second embodiment.
Figure 6B:
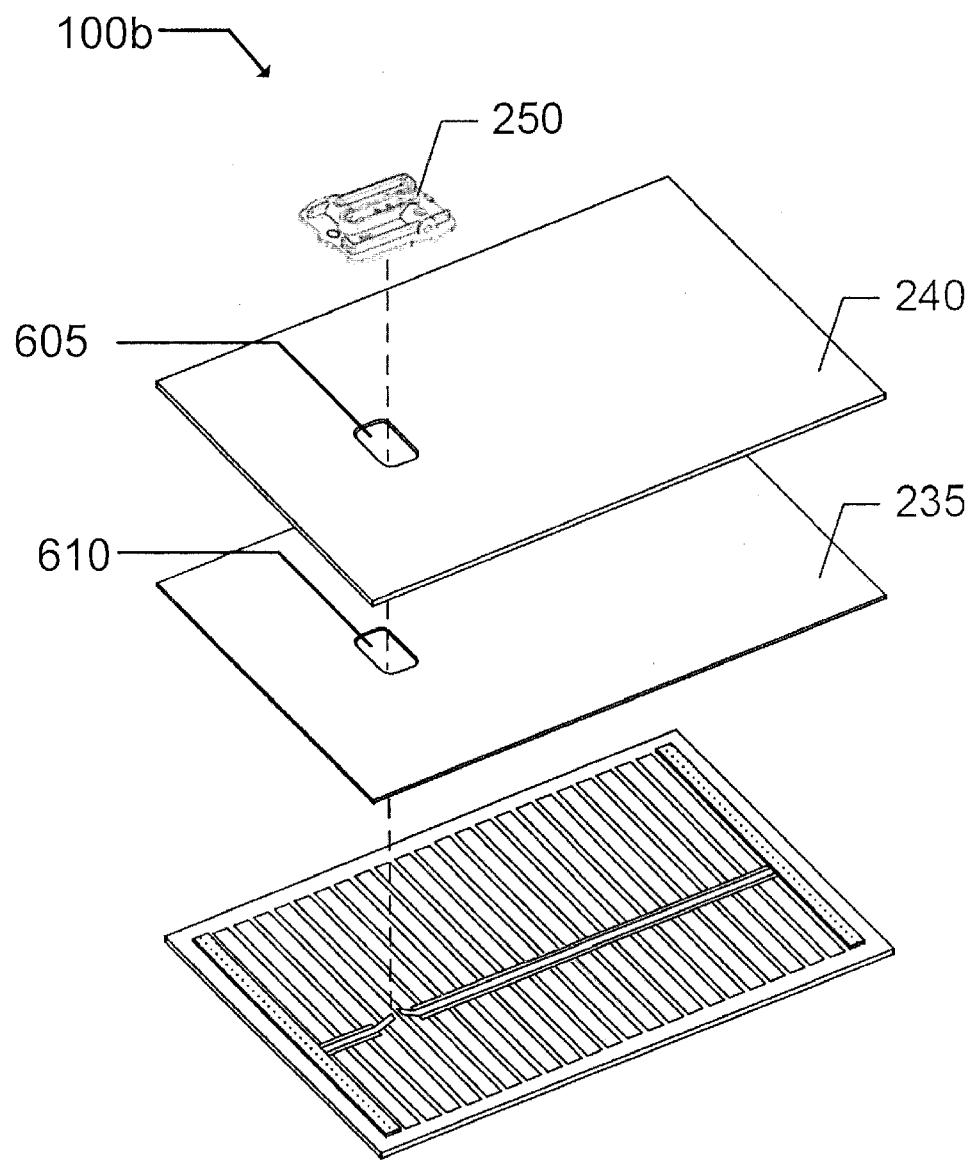
FIG. 6B is an exploded bottom perspective view of a photovoltaic device according to a third embodiment.
Figure 7:
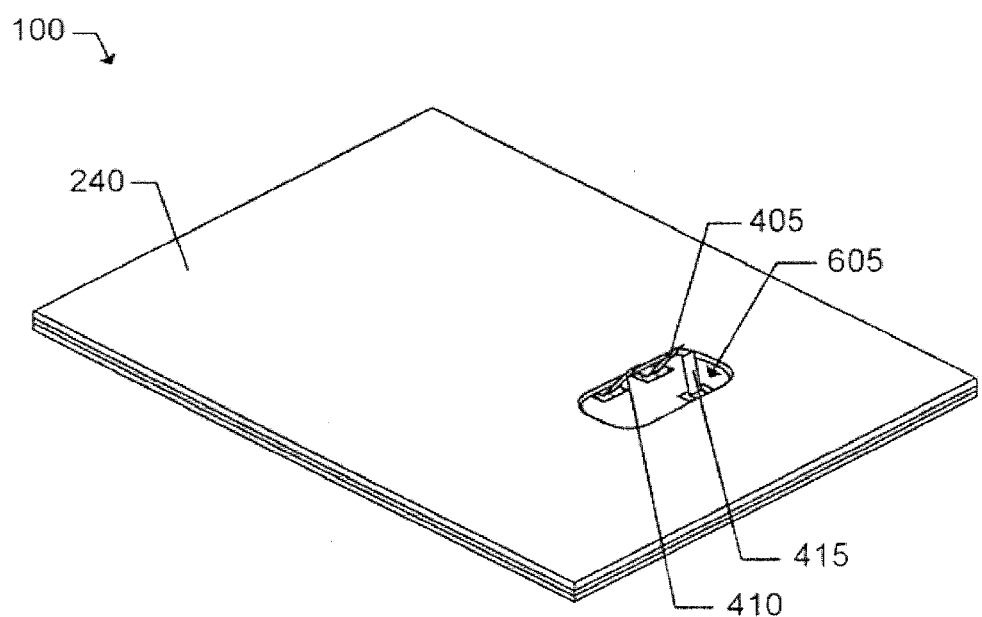
FIG. 7 is a bottom perspective view of a partially assembled photovoltaic device prior to depositing a filler composition.
Figure 7A:
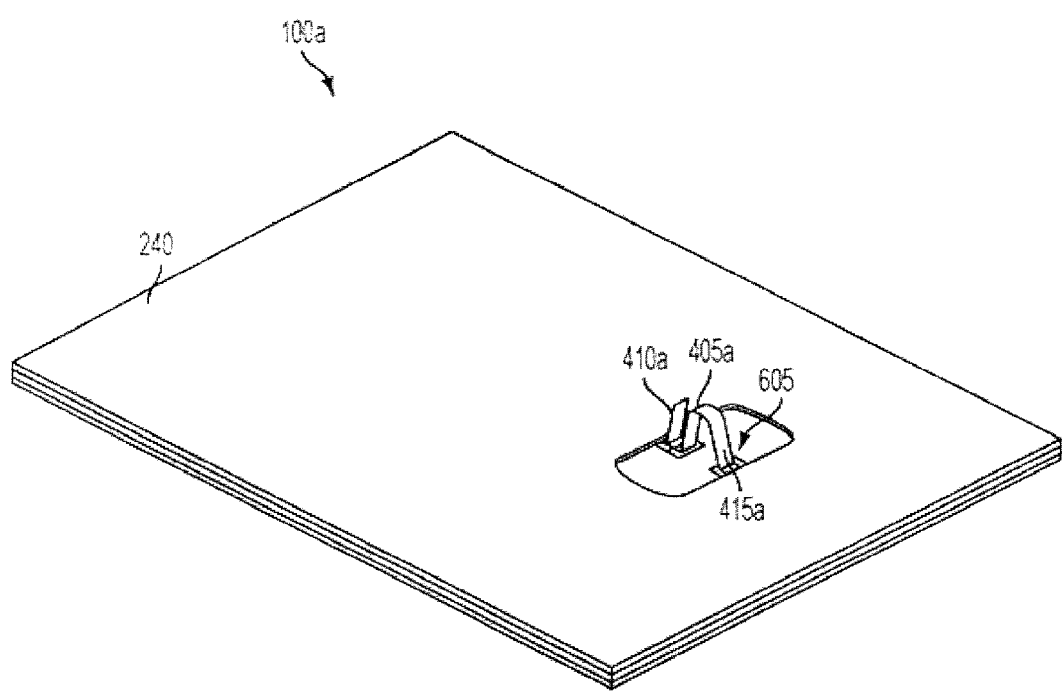
FIG. 7A is a bottom perspective view of a partially assembled photovoltaic device prior to depositing a filler composition according to a second embodiment.
Figure 7B:
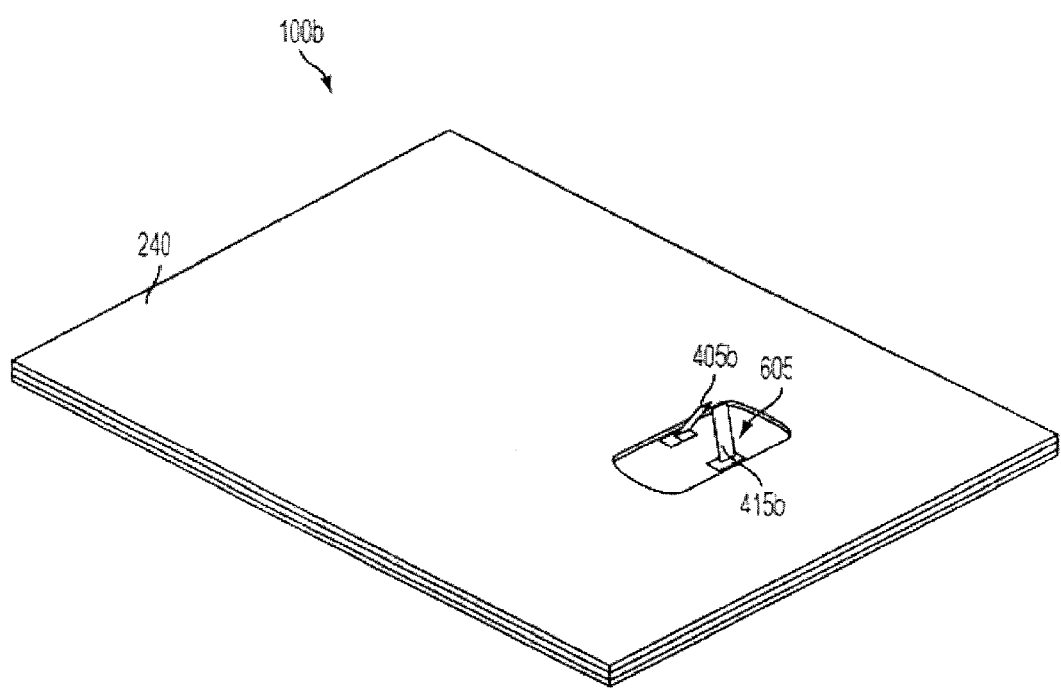
FIG. 7B is a bottom perspective view of a partially assembled photovoltaic device prior to depositing a filler composition according to a third embodiment.

As shown in FIG. 4, a first portion of conductive tape 405 may extend from a positive bus bar 445 to a location where an opening 605 in the back cover 240 will eventually be placed. The opening 605 in the back cover 240 is shown in FIGS. 6 and 7. Similarly, a second portion of conductive tape 410 may extend from a negative bus bar 450 to the location where the opening 605 will eventually be placed. If the device is made of a plurality of sub-devices, it may have additional bus bars and portions of conductive tape. For example, if the device is divided into two sub-devices, as shown in FIG. 4, it can include a third portion of conductive tape 415 extending from a second positive bus bar 455 to the location where the opening 605 will eventually be placed.

Figure 4A:
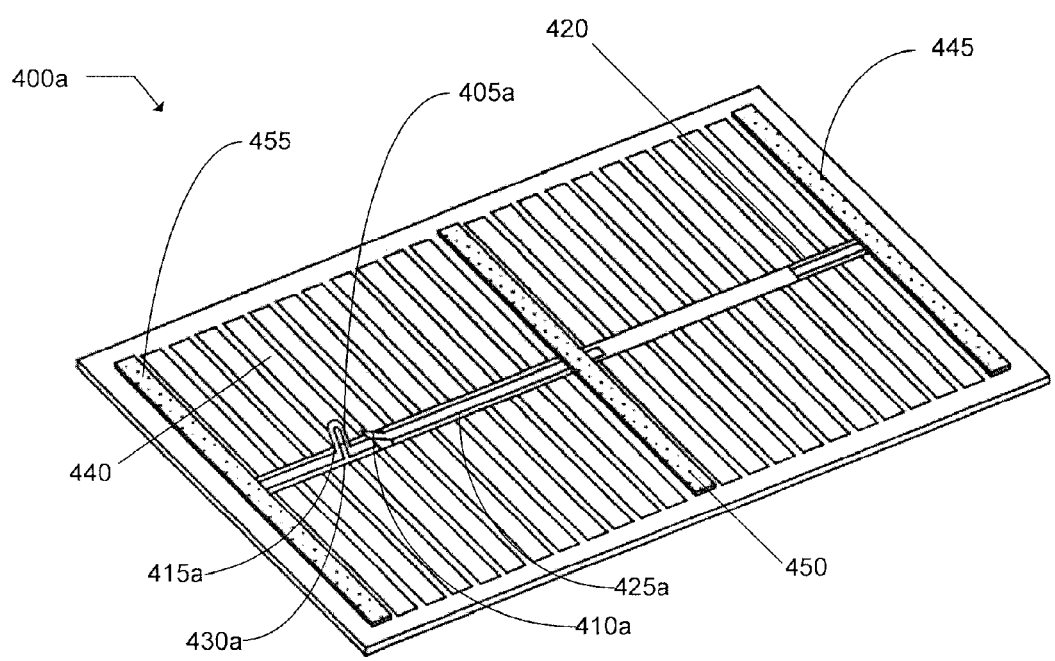
FIG. 4A is a bottom perspective view of a partially assembled photovoltaic device prior to installation of the interlayer and back cover according to a second embodiment.
Figure 4B:
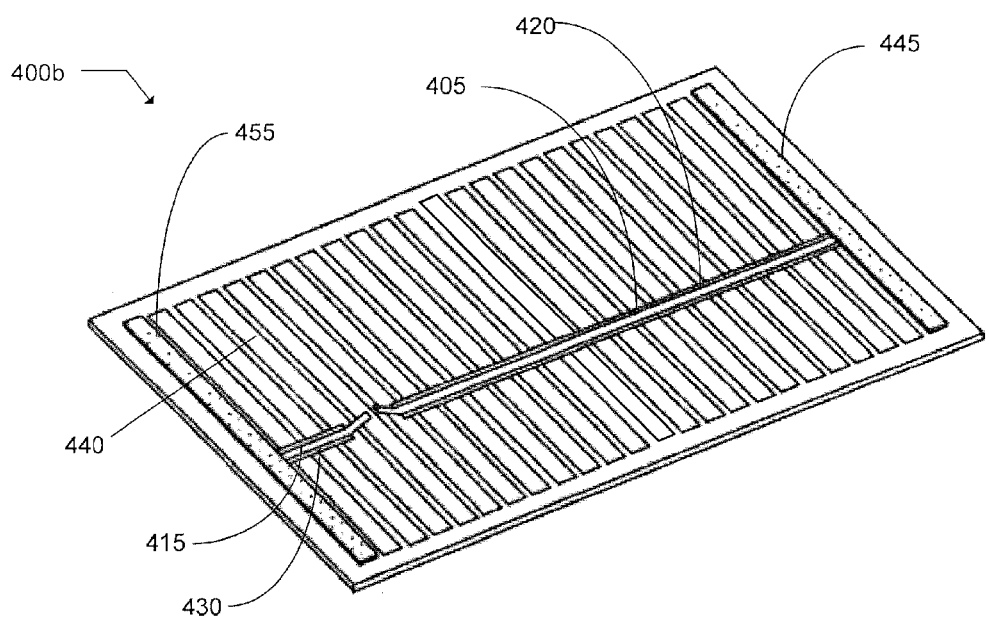
FIG. 4B is a bottom perspective view of a partially assembled photovoltaic device prior to installation of the interlayer and back cover according to a third embodiment.

In another embodiment, shown in FIG. 4A, the conductive tape 415a and 405a can be formed from a single conductive tape piece. The second portion of conductive tape 410a can be formed on top of the first conductive tape 405a, 415a, separated by an insulating tape 425a. In a third embodiment, shown in FIG. 4B, the second conductive tape 410 and bus bar 450 may be omitted.

FIG. 5 shows relative positions of the first portion of conductive tape 405, the first portion of insulating tape 420, and the first positive bus bar 445 in greater detail. As noted above, FIG. 5 shows a cross-sectional view of FIG. 4 taken along section B-B. The various layers within the plurality of cells 440 are visible. Interconnects 505 between adjacent cells are also visible. The interconnects 505 allow adjacent cells to be connected in a series configuration to increase voltage output. To increase current output, sub-devices can be connected in a parallel configuration. This is visible in FIG. 4 where the first and second sub-devices share a common negative bus bar 450. Note that although interconnects 505 are used for serial connections and bus bars 450 are used for parallel connections, the invention is not thus restricted. Accordingly, the interconnects 505 may provide parallel and/or serial connections as well as a combination thereof.

Once the portions of conductive tape (e.g. 405, 410, 415) have been installed, the back cover 240 may be installed over the portions of conductive tape, and the ends of the portions of conductive tape (e.g. 405, 410, 415) may be fed through the opening 605 in the back cover 240, as shown in FIG. 7. In some cases, an interlayer 235 may be installed to provide additional electrical insulation as well as a moisture barrier, as shown in FIG. 6. Similar to the back cover, the interlayer 235 may also include an opening 610 to allow passage of the portions of conductive tape. In other embodiments, shown in FIGS. 6A, 6B, 7A, and 7B, the interlayer 235 and cover 240 may be provided on the modules 100*a*, 100*b*, shown in FIGS. 4A and 4B.

Figure 8:
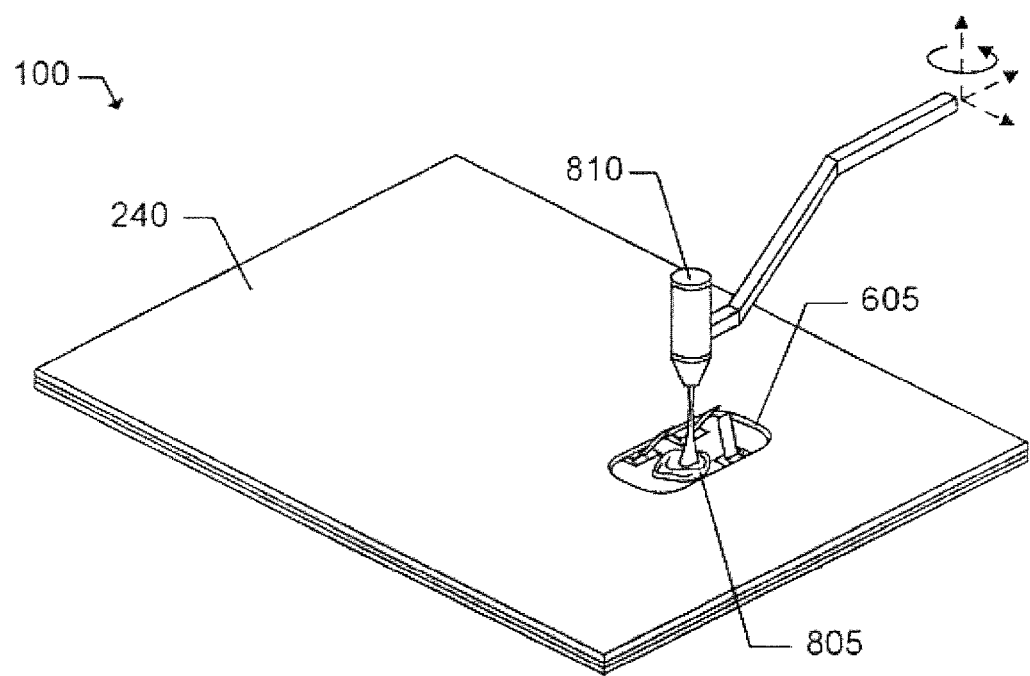
FIG. 8 is a bottom perspective view of a partially assembled photovoltaic device while depositing a moisture trapping filler composition.
Figure 8A:
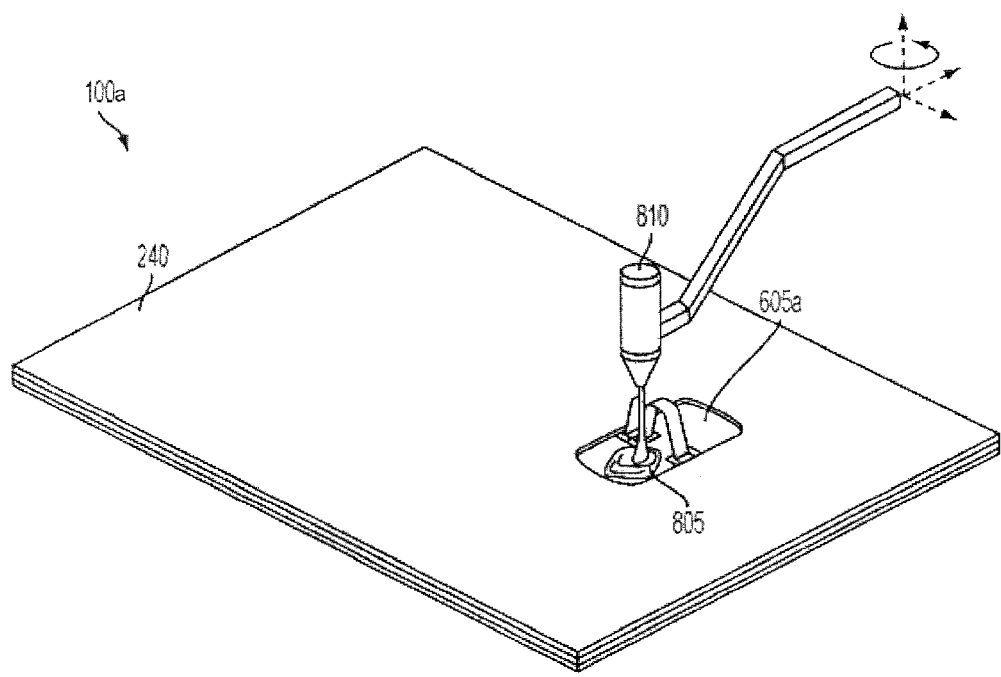
FIG. 8A is a bottom perspective view of a partially assembled photovoltaic device while depositing a moisture trapping filler composition according to a second embodiment.
Figure 8B:
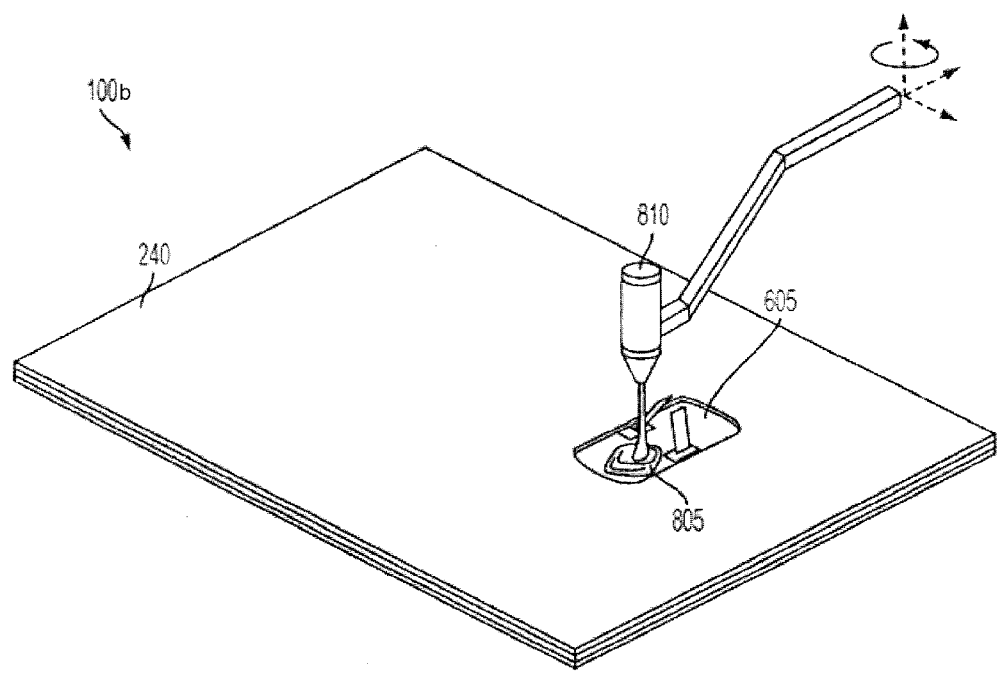
FIG. 8B is a bottom perspective view of a partially assembled photovoltaic device while depositing a moisture trapping filler composition according to a third embodiment.
Figure 9:
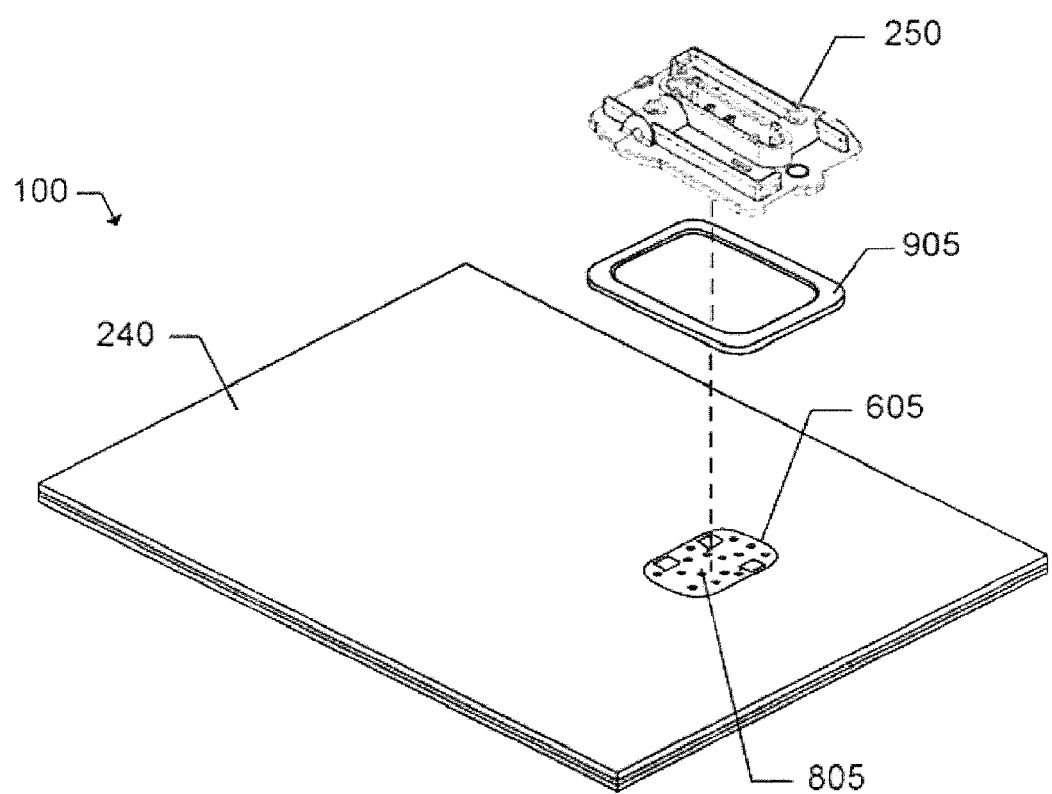
FIG. 9 is an exploded bottom perspective view of a photovoltaic device after depositing a moisture trapping filler composition.
Figure 9A:
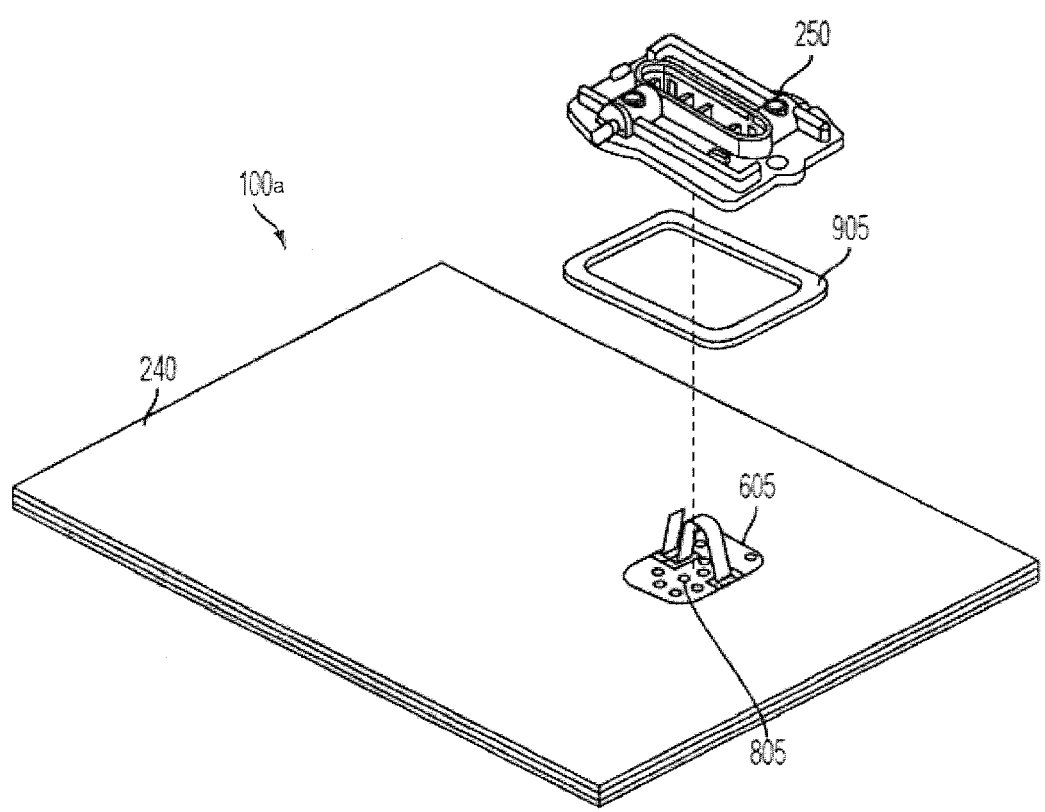
FIG. 9A is an exploded bottom perspective view of a photovoltaic device after depositing a moisture trapping filler composition according to a second embodiment.
Figure 9B:
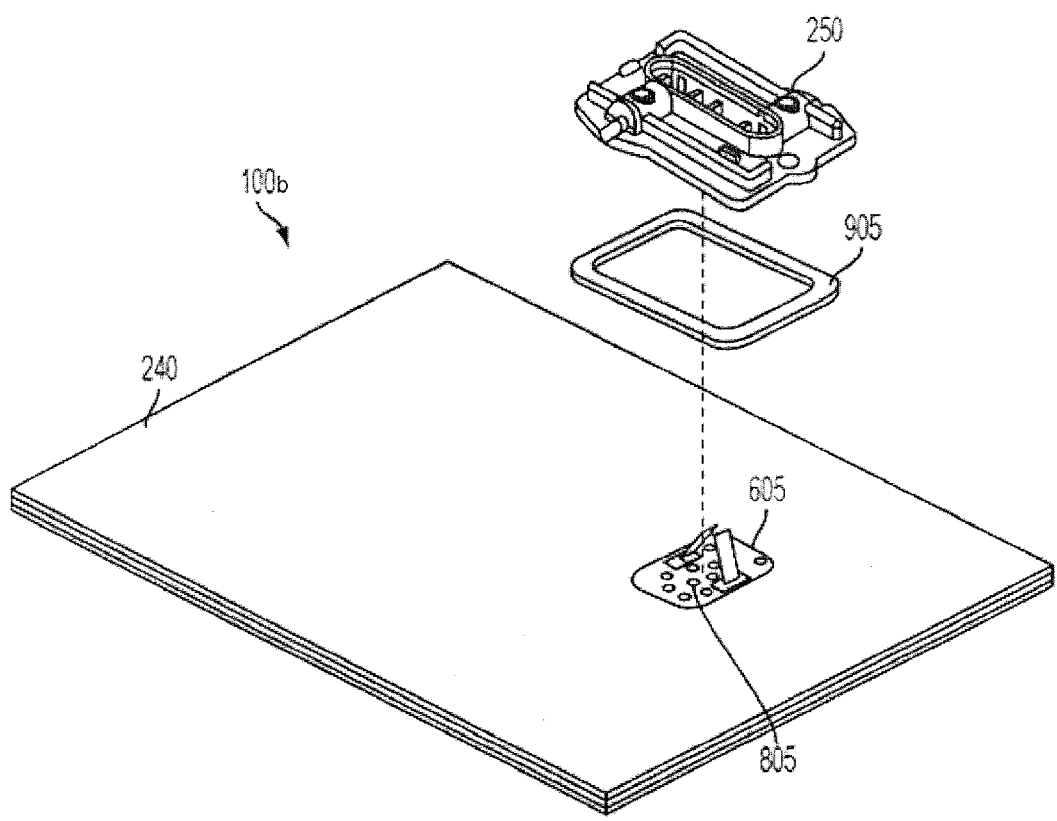
FIG. 9B is an exploded bottom perspective view of a photovoltaic device after depositing a moisture trapping filler composition according to a third embodiment.

Once the portions of conductive tape (e.g. 405, 410, 415) have been fed through the opening 605 in the back cover 240, a filler composition may be deposited into the opening 605 as shown in FIG. 8. The filler composition 805 may seal the opening 605 to prevent moisture from reaching the inner layers of the device 100. The filler composition 805 may include any suitable filler material having a low moisture vapor transmission rate ("MVTR"), such as, for example, polyurethane ("PUR"), epoxy, silicone, poly acrylic, butyl rubber, polyisobutylene ("PIB") rubber, polyolefin or EVA. The filler material may be a material that possesses stable physical and electrical properties over a wide range of temperatures. In one example, the filler material may be a polyurethane elastomer such as 20-2350. After the filler composition 805 has been deposited, a junction box 250 may be installed adjacent to the opening 605, and the adhesive layer 905 can be formed between the back cover 240 and the junction box 250, as shown in FIGS. 9, 9A, and 9B. The adhesive layer 905 may include flowable sealants or foam tapes. For instance, a flowable sealant such as silicone, polyurethane, or butyl rubber may be used to form a seal between the junction box 250 and the back cover 240. Alternately, a double-coated acrylic foam tape, such as 3M's 5952 VHB Acrylic Foam Tape, may be used to form the seal between the junction box 250 and the back cover 240. Similarly, as is shown in FIGS. 8A and 8B, the filler composition 805 may be provided to seal the opening 605 in the modules 100*a*, 100*b*.

As shown in FIGS. 2, 9, 9A, and 9B, the junction box 250 may be attached to the back cover 240 of the PV device 100 proximate the opening 605. As discussed above, the opening 605 allows conductive tape, which serves as electrical wiring, to extend from within the device to the junction box 250 where it can be electrically connected. Once the connections have been made, the opening 605 is sealed to ensure that moisture does not reach the inner layers of the device and cause electrical shorting or corrosion. Specifically, if the opening 605 is not properly sealed, moisture from precipitation or condensation may enter the photovoltaic device. In colder climates, the moisture may repeatedly freeze and thaw causing structural and electrical complications in the device. To address these issues, as well as others that will become apparent from this discussion, a new sealing compound and method for sealing the opening 605 are described herein.

As described above, the opening 605 may serve as a gateway for the electrical wiring to exit the device 100 where it can be connected to the junction box 250. The electrical wiring may include any suitable type of wiring. However, since it may be desirable to produce a thin and light device to allow for ease of transport and installation, it may also be desirable to select wiring that is thin and light. So, conductive tape may be used as a substitute for conventional stranded copper wiring. The conductive tape may include any suitable material, such as, for example, copper, aluminum, silver, or gold. Since the conductive tape may be susceptible to moisture-induced corrosion, plating may be applied to prevent surface oxidation. For instance, the conductive tape may include tin-plating over copper tape.

To enable the junction box 250 to completely cover the opening 605, the perimeter of the junction box 250 may be larger than the opening 605. As a result, the junction box 250 may provide an additional moisture barrier which prevents water from reaching the filler composition 805 in the opening 605. Consequently, the filler composition 805 is not directly exposed to precipitation on a regular basis as are the outer surfaces of the junction box 250. However, if the seal between the junction box 250 and the back cover 240 begins to leak or fails entirely, moisture can reach the filler composition 805 in the opening 605. In such cases, moisture can accumulate inside the junction box 250 over time. As noted above, moisture is undesirable because it promotes corrosion, electrical shorting, and other complications resulting from the freezing of water. More specifically, since water expands when it freezes, it exerts forces against its surroundings, which can lead to structural damage to the device. If even a small amount of water breaches the seal between the junction box 250 and the back cover 240 and subsequently freezes, it can dislodge the junction box from the back cover. Dislodging of the junction box 250 may occur over a period of time where numerous freeze-thaw cycles enable the water to separate the seal around the perimeter of the junction box. As the seal is separated, additional moisture may gain access to the junction box thereby hastening the process.

As a first line of defense, it is desirable to restrict moisture from entering the junction box 250 by using adhesive layer 905 between the junction box 250 and the back cover 240 as shown in FIGS. 9, 9A, and 9B. However, in cases where moisture gains access to the junction box 250, it is desirable to prevent the moisture from causing more significant problems over time. So, it can be desirable to trap or contain any moisture that enters the junction box 250 to prevent it from causing any electrical and/or mechanical damages to the device 100. To accomplish these objectives, it may be desirable to deposit a moisture trapping filler composition 805 in the opening 605 as shown in FIG. 8. In one example, the composition may be deposited using a dispensing valve 810 connected to a dispensing machine. Alternately, the composition 805 may be deposited manually or by any other suitable method.

The moisture trapping filler composition 805 may include a desiccant material integrated into a filler material. The desiccant material may include aluminum oxide, silica gel, calcium oxide, clay, calcium sulfate, or any type of molecular sieve material or any other suitable material. If a molecular sieve material is used, it may contain tiny pores of a precise and uniform size that are used to adsorb gases or liquids. Molecules that are small enough to pass through the pores are trapped and adsorbed while larger molecules are not. For example, a water molecule may be small enough to pass through the pores while larger molecules are not. Therefore, water molecules may enter the pores and become trapped, thereby allowing the molecular sieve material to function as a desiccant. For that reason, the molecular sieve material may extract moisture from the internal volume of the junction box 250 and thereby prevent it from causing structural damage to the device.

The molecular sieve material may include any suitable material such as, for example, aluminosilicate minerals, clays, dry polyacrylic acid ("PAA"), porous glasses, microporous charcoals, zeolites, active carbons, or synthetic compounds that have open structures through which small molecules, such as water, can diffuse. In another example, the molecular sieve material may include aluminosilicate zeolites with crystalline structures. These crystalline structures may be formed from a network of silicon, aluminum and oxygen atoms having empty spaces between atoms. These empty spaces define "pores" having dimensions specific to the molecular sieve type involved, where the type is defined by the molecule to be trapped.

To effectively trap water molecules, which are about 3.2 Angstroms in size, the pores may have an average size ranging from 3.2 to 25 Angstroms to permit water molecules to enter the pores and become trapped. For reference, silica gel, which is a common and effective desiccant, has an average pore diameter of 24 Angstroms. In another example, the pores of the molecular sieve material may have an average size ranging from 3.2 to 10 Angstroms. In yet another example, the pores may have an average size ranging from 3.2 to 5 Angstroms. Within the molecular sieve material, the pore sizes may be uniform or the pore sizes may vary according to a distribution of particle sizes. So, a molecular sieve material having pores with an "average size" of 4 Angstroms can represent a variety of configurations.

The desiccant material may have any suitable form. For example, the material may be a powder, a paste, or a plurality of beads or pellets. Whatever the desiccant material's form, it may be incorporated into the filler material before, during, or after the filler material is deposited into the opening 605. If heat treatment is applied, the desiccant material should be incorporated before the filler material becomes unworkable due to curing.

The desiccant material can be distributed uniformly or non-uniformly throughout the filler material. In one example, the distribution of desiccant within the filler may not be uniform. Instead, the concentration of desiccant in the filler material may be higher proximate the junction box and may be lower or zero proximate the inner layers of the device. So, the volumetric ratio of the desiccant material to the filler material may increase in a direction toward an outer surface of the device (i.e. away from the device). This example configuration allows moisture to be absorbed proximate the junction box, but does not provide pathways for water molecules to migrate through the filler material to the inner layers of the device. Accordingly, it may be desirable to have a filler composition that is "filler-rich" near the inner layers of the device to prevent water molecule migration and "desiccant-rich" near the outer surface of the device to prevent moisture accumulation in the inner volume of the junction box 250.

As an alternative, molecular sieves can be used that have pores greater than 3.2 angstroms at the surface to allow water molecules to enter, and use a molecular sieve that has pores of less than 3.2 angstroms closer to the inner layer to effectively trap the water molecules.

The volumetric ratio of desiccant material to filler material may have any suitable ratio. For example, the volumetric ratio of desiccant material to filler material may range from 1% to 95%. The volumetric ratio of desiccant material to filler material may range from 1% to 75%. The volumetric ratio of desiccant material to filler material may range from 5% to 50%. More preferably, the volumetric ratio of desiccant material to filler material may range from 10% to 50%. It may be desirable to adjust the volumetric ratio based on how and where the filler composition will be used. For example, if the filler composition will be used in a humid environment, it may be preferable to include a higher ratio of desiccant material in the composition. Conversely, if the filler composition will be used in a non-humid environment, it may be preferable to include a lower ratio of desiccant material in the composition.

The junction box 250 may include a removable lid that provides access to the electrical connections within the junction box 250. For example, when the lid is removed, the ends of the first and second portions of conductive tape (405, 410) may be accessible and may be connected to a first and second cable (120, 125) extending from the junction box 250, as shown in FIG. 2. The end of the first portion of conductive tape 405 can be electrically connected to the first cable 120, and, similarly, the end of the second portion of conductive tape 410 can be electrically connected to the second cable 125. As shown in FIG. 2, the first and second cables (120, 125) may include a first and a second connector (130, 135), respectively, at their ends. The connectors (130, 135) may allow for easy connection to other devices or components in a photovoltaic array.

In one aspect, a filler composition comprises a filler material and a desiccant material within the filler material. The filler material can include polyurethane, epoxy, silicone, poly acrylic, butyl rubber, polyisobutylene rubber, polyolefin, or ethylene vinyl acetate. The filler material can include aluminosilicate zeolite, polyaluminum oxide, polyacrylic acid, silica gel, calcium oxide, clay, or calcium sulfate. A volumetric ratio of the desiccant material to the filler material can be between 1% and 95%, between 1% and 75%, or between 10% and 50%. The desiccant material can be uniformly distributed in the filler material. Alternately, the desiccant material is non-uniformly distributed in the filler material. For instance, a volumetric ratio of the desiccant material to the filler material can increase in a direction through the filler material. The desiccant material can have an average pore size between 3 and 25 Angstroms, between 3.2 and 10 Angstroms, or between 3.2 and 5 Angstroms.

In another aspect, a photovoltaic device can include a filler composition. The filler composition can include a filler material and a desiccant material within the filler material. The filler material can include polyurethane, epoxy, silicone, poly acrylic, butyl rubber, polyisobutylene rubber, polyolefin, or ethylene vinyl acetate. The desiccant material can include aluminosilicate zeolite, polyaluminum oxide, polyacrylic acid, silica gel, calcium oxide, clay, or calcium sulfate. A volumetric ratio of the desiccant material to the filler material can be between 1% and 95%, between 1% and 75%, or between 10% and 50%. The desiccant material can be uniformly distributed in the filler material. Alternately, the desiccant material can be non-uniformly distributed in the filler material. For instance, a volumetric ratio of the desiccant material to the filler material can increase in a direction toward an outer surface of the device. The desiccant material can have an average pore size between 3 and 25 Angstroms, between 3.2 and 10 Angstroms, or between 3.2 and 5 Angstroms.

A method for sealing an opening in a photovoltaic device can include combining a desiccant material with a filler material to form a moisture trapping filler composition and depositing the moisture trapping filler composition in an opening in a photovoltaic device. The method can also include uniformly distributing the desiccant material in the filler material. Alternately, the method can include non-uniformly distributing the desiccant material in the filler material. For instance, a volumetric ratio of the desiccant material to the filler material can increase in a direction toward an outer surface of the device.

A method for manufacturing a photovoltaic device can include depositing a moisture trapping filler composition in an opening of a surface of a photovoltaic device. The moisture trapping filler composition can include a filler material and a desiccant material. The method can include forming an adhesive layer adjacent to the surface wherein the adhesive layer circumscribes the opening. The method can include placing a junction box adjacent to the adhesive layer, and the junction box can cover the entire opening. The method can include uniformly distributing the desiccant material in the filler material. Alternately, the method can include non-uniformly distributing the desiccant material in the filler material. For instance, a volumetric ratio of the desiccant material to the filler material can increase in a direction away from the device.

Each of the above-described layers may include more than one layer or film. Additionally, each layer can cover all or a portion of the device and/or all or a portion of the layer or substrate underlying the layer. A "layer" can include any amount of any material that contacts all or a portion of a surface. Additionally, any layer can be formed through any suitable deposition technique such as, for example, physical vapor deposition, atomic layer deposition, laser ablation, chemical vapor deposition, close-spaced sublimation, electrodeposition, screen printing, DC pulsed sputtering, RF sputtering, AC sputtering, chemical bath deposition, vapor transport deposition, or any other equivalent technique.

The apparatus and methods disclosed herein may be applied to any type of photovoltaic technology including, for example, cadmium telluride, cadmium selenide, amorphous silicon, copper indium (di)selenide (CIS), and copper indium gallium (di)selenide (CIGS). Several of these photovoltaic technologies are discussed in U.S. patent application Ser. No. 12/572,172, filed on Oct. 1, 2009, which is incorporated by reference in its entirety.

It should be understood that a photovoltaic device and components thereof can be configured to allow any suitable light absorbing material to be incorporated into the photovoltaic device.

Details of one or more embodiments are set forth in the accompanying drawings and description. Other features, objects, and advantages will be apparent from the description, drawings, and claims. Although a number of embodiments of the invention have been described, it will be understood that various modifications may be made without departing from the spirit and scope of the invention. It should also be understood that the appended drawings are not necessarily to scale, presenting a somewhat simplified representation of various features and basic principles of the invention.

What is claimed is:

1. A moisture trapping filler composition comprising:
   a filler material; and
   a desiccant material within the filler, wherein the desiccant material is non-uniformly distributed in the filler material.

2. The filler composition of claim 1, wherein a volumetric ratio of the desiccant material to the filler material increases in a direction through the filler material.

3. The filler composition of claim 1, wherein the filler material comprises polyurethane, epoxy, silicone, poly acrylic, butyl rubber, polyisobutylene rubber, polyolefin, or ethylene vinyl acetate.

4. The filler composition of claim 1, wherein the desiccant material comprises aluminosilicate zeolite, polyaluminum oxide, polyacrylic acid, silica gel, calcium oxide, clay, or calcium sulfate.

5. The filler composition of claim 1, wherein a volumetric ratio of the desiccant material to the filler material is between 1% and 95%.

6. The filler composition of claim 5, wherein the volumetric ratio of the desiccant material to the filler material is between 1% and 75%.

7. The filler composition of claim 6, wherein the volumetric ratio of the desiccant material to the filler material is between 10% and 50%.

8. The filler composition of claim 1, wherein the desiccant material has an average pore size between 3 and 25 Angstroms.

9. The filler composition of claim 8, wherein the desiccant material has an average pore size between 3.2 and 10 Angstroms.

10. The filler composition of claim 9, wherein the desiccant material has an average pore size between 3.2 and 5 Angstroms.

11. A photovoltaic device comprising a moisture trapping filler composition sealing a portion of the photovoltaic device, wherein the filler composition comprises:
    a filler material; and
    a dessiccant material within the filler material, wherein the desiccant material is non-uniformly distributed in the filler material.

12. The photovoltaic device of claim 11, wherein a volumetric ratio of the desiccant material to the filler material increases in a direction toward an outer surface of the device.

13. The photovoltaic device of claim 11, wherein the filler material comprises polyurethane, epoxy, silicone, poly acrylic, butyl rubber, polyisobutylene rubber, polyolefin, or ethylene vinyl acetate.

14. The photovoltaic device of claim 11, wherein the desiccant material comprises aluminosilicate zeolite, polyaluminum oxide, polyacrylic acid, silica gel, calcium oxide, clay, or calcium sulfate.

15. The photovoltaic device of claim 11, wherein a volumetric ratio of the desiccant material to the filler material is between 1% and 95%.

16. The photovoltaic device of claim 15, wherein the volumetric ratio of the desiccant material to the filler material is between 1% and 75%.

17. The photovoltaic device of claim 16, wherein the volumetric ratio of the desiccant material to the filler material is between 10% and 50%.

18. The photovoltaic device of claim 11, wherein the desiccant material has an average pore size between 3 and 25 Angstroms.

19. The photovoltaic device of claim 18, wherein the desiccant material has an average pore size between 3.2 and 10 Angstroms.

20. The photovoltaic device of claim 19, wherein the desiccant material has an average pore size between 3.2 and 5 Angstroms.

21. A method for sealing an opening in a photovoltaic device, the method comprising:
    forming a dessiccant material within a filler material to form a moisture trapping filler composition; and
    depositing the moisture trapping filler composition in an opening in a photovoltaic device, wherein the deposited moisture trapping filler composition has the dessiccant material non-uniformly distributed in the filler material.

22. The method of claim 21, wherein a volumetric ratio of the desiccant material to the filler material in the deposited moisture trapping filler composition increases in a direction toward an outer surface of the device.

23. A method for manufacturing a photovoltaic device, the method comprising:
    depositing a moisture trapping filler composition in an opening of a surface of a photovoltaic device, wherein the deposited moisture trapping filler composition comprises a dessiccant material non-uniformly distributed in a filler material;

forming an adhesive layer adjacent to the surface, wherein the adhesive layer circumscribes the opening; and placing a junction box adjacent to the adhesive layer, wherein the junction box covers the entire opening.

24. The method of claim 23, wherein a volumetric ratio of the desiccant material to the filler material in the deposited moisture trapping filler composition increases in a direction away from the device.

25. The photovoltaic device of claim 11, further comprising:

an adhesive layer adjacent to a surface of the photovoltaic device, wherein the adhesive layer circumscribes an opening in the surface of the photovoltaic device; and a junction box adjacent to the adhesive layer, wherein the junction box covers the opening.

26. The photovoltaic device of claim 25, wherein the concentration of desiccant material within the filler material increases as a distance from the junction box decreases.

27. The photovoltaic device of claim 25, wherein the concentration of desiccant material within the filler material is greatest proximate to the opening.

28. The photovoltaic device of claim 11 wherein the portion comprises an opening in a surface of the photovoltaic device.

* * * * *